United States Patent [19]

Green

[11] Patent Number: 4,475,122

[45] Date of Patent: Oct. 2, 1984

[54] AUTOMATIC WAFER ALIGNMENT TECHNIQUE

[75] Inventor: Lawrence S. Green, Los Angeles, Calif.

[73] Assignee: TRE Semiconductor Equipment Corporation, Woodland Hills, Calif.

[21] Appl. No.: 319,782

[22] Filed: Nov. 9, 1981

[51] Int. Cl.³ .............................................. H04N 7/18
[52] U.S. Cl. ....................................... 358/101; 382/8; 358/107
[58] Field of Search ..................... 358/101, 106, 107; 382/44–48, 8; 364/468; 356/400, 401

[56] References Cited

U.S. PATENT DOCUMENTS

| | | | |
|---|---|---|---|
| 4,052,603 | 10/1977 | Karlson | 364/468 |
| 4,153,371 | 5/1979 | Koizumi | 356/400 |
| 4,203,132 | 5/1980 | Schmitt | 358/101 |
| 4,245,243 | 1/1981 | Gutjahr et al. | 358/106 |
| 4,249,212 | 2/1981 | Ito et al. | 358/183 |
| 4,253,112 | 2/1981 | Doemens | 358/101 |
| 4,301,470 | 11/1981 | Pagany | 358/101 |
| 4,334,241 | 6/1982 | Kashioka | 358/107 |

FOREIGN PATENT DOCUMENTS

| | | |
|---|---|---|
| 5462 | 11/1979 | European Pat. Off. . |
| 37663 | 10/1981 | European Pat. Off. . |
| 2910580 | 9/1980 | Fed. Rep. of Germany . |
| 3014629 | 10/1980 | Fed. Rep. of Germany . |

Primary Examiner—Howard W. Britton
Attorney, Agent, or Firm—Spensley Horn Jubas & Lubitz

[57] ABSTRACT

This automatic wafer alignment technique may be used in a step-and-repeat photomicrolithographic exposure system accurately to prealign a wafer before exposure to the B-level and subsequent reticles, and automatically to align the wafer at each die site prior to exposure. A search technique optimizes location of the global targets used for wafer prealignment. The search begins at the most likely target position and proceeds through a search area established by the maximum expected rough prealignment error. A wafer alignment target configuration consisting of a cross with one elongated arm and a short crossbar is used to optimize target verification. To locate targets a video image is digitized and the average intensity at each video scan line and column is obtained and stored. This data is used to determine the presence in the video image of feature edges. A table of all such edges is established. These listed edges are correlated to determine all pairs of edges that may represent potential targets. From these, the best target is selected by comparing certain weighted parameters of each potential target.

11 Claims, 24 Drawing Figures

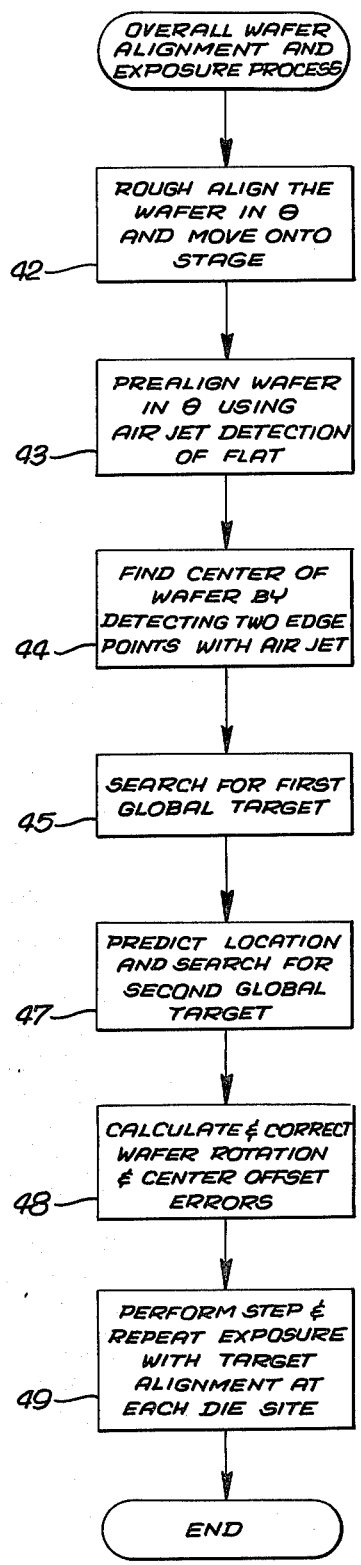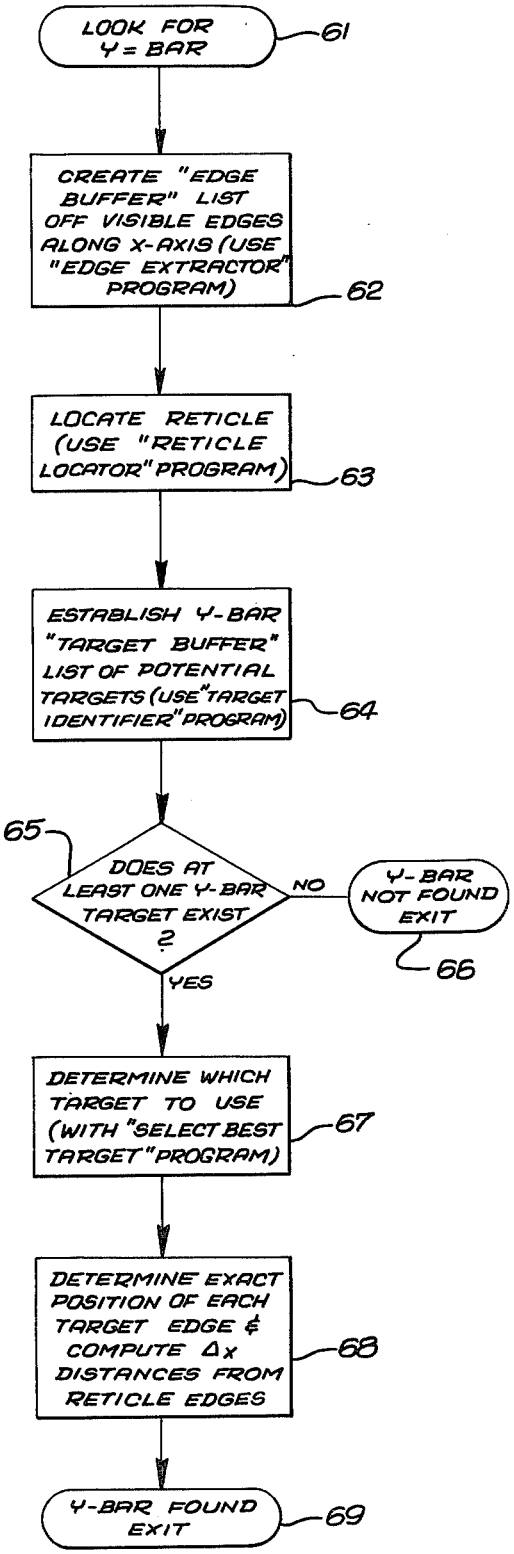

SEARCH FOR FIRST GLOBAL TARGET

SEARCH FOR X-BAR

Fig. 15

DATA BUFFER

| SAMPLE POINT INDEX (SCAN LINE OR COLUMN) | INTENSITY | INTENSITY DIFFERENCE (SIGNED) |
|---|---|---|
| 0 | $V_0$ | |
| 1 | $V_1$ | $(V_1 - V_0)$ |
| 2 | $V_2$ | $(V_2 - V_1)$ |
| 3 | $V_3$ | $(V_3 - V_2)$ |
| 4 | $V_4$ | $(V_4 - V_3)$ |
| . | . | . |
| . | . | . |
| . | . | . |
| 254 | $V_{254}$ | $(V_{254} - V_{253})$ |
| 255 | $V_{255}$ | $(V_{255} - V_{254})$ |

Fig. 16

EDGE BUFFER

| INDEX NUMBER OF EDGE | LEFT END LOCATION (PIXEL) | RIGHT END LOCATION (PIXEL) | HEIGHT (SIGNED) |
|---|---|---|---|
| 1 | 4 | 16 | $V_{16} - V_4$ |
| 2 | | | |
| 3 | | | |
| 4 | | | |
| . | | | |
| . | | | |
| . | | | |

Fig. 19

TARGET BUFFER

| NUMBER OF POTENTIAL TARGET | NUMBER OF LEFT EDGE | NUMBER OF RIGHT EDGE |
|---|---|---|
| 1 | 4 | 8 |
| 2 | 4 | 14 |
| 3 | | |
| 4 | | |
| . | | |
| . | | |
| . | | |

VERIFY TARGET

AUTOMATIC WAFER ALIGNMENT TECHNIQUE

BACKGROUND OF THE INVENTION

1. Field Of The Invention

The present invention relates to a technique for automatically aligning a semiconductor wafer prior to step-and-repeat microphotolithographic exposure, and for automatic die-by-die alignment during the exposure processing.

2. Description Of The Prior Art

In conventional integrated circuit fabrication, a semiconductor wafer typically undergoes from four to ten major process steps, at each of which steps part of a circuit pattern is exposed from a mask or reticle onto the wafer. In "step-and-repeat" processing, an enlarged mask, typically ten times actual size, contains the circuit pattern for one or a very few individual die sites. The wafer is positioned at one of these die sites, and a reduced image of the mask pattern is exposed onto photoresist covering the wafer through a size reducing lens system. The wafer is then stepped to the next die site and the mask exposure is repeated. This step-and-repeat operation continues until all die sites have been exposed.

For optimum yield, the pattern images of each subsequent mask must be formed in perfect registration with the circuit elements formed during prior steps. As a minimum, this requires that prior to exposure by each subsequent mask, the wafer must be perfectly located and aligned in the step-and-repeat apparatus, and must be accurately stepped from one die site to the next. Optimally, an individual alignment should be performed at each die site. Die-by-die alignment is preferred, since distortion of the wafer may occur during individual process steps. As a result, although exact uniform spacing existed between the circuits at individual die sites during earlier process steps, the spacing may differ slightly during successive steps. If the wafer is then merely moved a fixed distance from site to site, without individual site alignment, misregistration may occur at some or all of the die sites during exposure to the masks used for these later processing steps.

The speed at which both initial wafer alignment and die-by-die alignment is achieved must be minimized. Step and repeat exposure systems are very expensive, typically costing hundreds of thousands of dollars. For cost effective use of such equipment, the time for processing each wafer must be minimized. Optimally, all alignment operations shold be automated so that no operator intervention is required throughout the entire wafer alignment and step-and-repeat exposure operation. Such cost effectiveness is not achieved if, for example, it is necessary for an operator to use a joy stick to position and align the wafer while watching an alignment target on a video display. An object of the present invention is to provide a technique for automatic alignment of each wafer in the step-and-repeat apparatus without any operator intervention.

Techniques for die-by-die alignment have been suggested in the past. These are taught e.g., in the U.S. Pat. No. 4,052,603 to Karlson, U.S. Pat. No. 4,153,371 to Koizumi. Die-by-die alignment also is shown in the copending U.S. patent application Ser. No. 330,498, a continuation of Ser. No. 238,148 entitled SINGLE LENS REPEATER assigned to TRE Corporation, the assignee of the present application.

Advantageously, the initial or "A-level" mask contains both the circuit pattern for the intial processing step, and a wafer target pattern which is exposed onto the wafer along with the circuit pattern itself. Typically this wafer alignment target is exposed in the alley along which the wafer ultimately will be scribed to separate the individual circuit chips.

During the initial processing step the exposed wafer alignment target is subjected the same processing as the circuit itself. For example, this may comprise the diffusion of an N- or P- type dopant into the semiconductor wafer. In this manner, a die alignment target is formed in the wafer at each die site. It is this alignment target which is used during subsequent mask exposure steps to accomplish die-by-die alignment. Two or more of the same or different wafer alignment targets also may be used for accurate prealignment of the wafer at the beginning of each successive mask exposure operation.

Beginning with the second or "B-level" mask, each mask is provided both with the requisite circuit pattern and with a reticle alignment window or target. For die-by-die alignment, when the wafer is stepped to each die site, appropriate viewing optics are used simultaneously to view the alignment target on the wafer and the complementary alignment target or window on the reticle. The wafer is then moved relative to the mask until perfect alignment is achieved. An object of the present invention is to accomplish such die-by-die alignment automatically.

To best facilitate such step-and-repeat exposure operation, it is advantageous to prealign the wafer with the X- and Y- axes of the exposure system. In this way, the circuit patterns at each die site can be aligned in an orthogonal matrix, with a substantially fixed distance between each die site. In a typical apparatus, each wafer is roughly aligned prior to transport onto the exposure table by detection of a flat sector on the wafer. The roughly aligned wafer is transported onto a table that is accurately positionable beneath the system exposure lens. Advantageously, this table not only can be moved accurately along the X- and Y- axes of the system, but also can be rotated sufficiently to eliminate any rotational error that may exist when the wafer is first mechanically transported onto the table.

Another object of the present invention is to achieve automatic, precise and accurate prealignment of the wafer after it is placed onto the wafer table, but prior to circuit exposure. Another objective is to achieve such prealignment by reference to an arbitrary two or more of the die site alignment targets. These are referred to herein as "global" targets, and a further object of the present invention is to provide an automatic system for locating, identifying and verifying such global targets as part of the prealignment process. A further objective is to provide a search scheme for locating the global targets in the event that the mechanical prealignment of the wafer was not error free.

To accomplish such automatic alignment, the wafer target and the reticle window or target are viewed simultaneously using a video camera. The video scan image is converted to a digital format for appropritate data processing. A further object of the present invention is to provide appropriate methods for handling this digitized data to accomplish wafer alignment.

A problem encountered by such a system is that of distinguishing the actual wafer target from other indicia or circuit elements on the wafer. In a manual, joy stick-controlled system, an operator observing the video display generally can visually distinguish a true target from other indicia on the wafer. Such human pattern recognition capability cannot readily be machine synthesized. However, a further object of the present invention is to provide an automated technique that is capable of distinguishing between an actual wafer alignment target and other indicia on the wafer.

A further problem which complicates wafer alignment concerns the ability to distinguish the wafer target from the surrounding area on the wafer. Recall that the target itself is formed on or within the wafer by certain process steps such as diffusion. Thus the target must be recognized by distinguishing between the amplitude or phase of light reflected from the target itself and light reflected from areas on the wafer immediately adjacent to the target. For most process steps, the difference in reflected light intensity is sufficiently great so as to enable the target readily to be seen. But this may not be the case at other process steps. As a typical example, prior to the process step in which electrical (ohmic) connections are made between circuit elements, a metalized layer is deposited onto the wafer. This layer is highly light reflective. Consequently, the difference in intensity between light reflected from the wafer target and light reflected from the surrounding region on the wafer is very slight.

Distinguishing such target may be aided by detecting differences in phase of the light reflected from the target and that reflected from the surrounding region. This approach is disclosed in the co-pending U.S. patent application Ser. No. 248,605 now U.S Pat. No. 4,419,013 entitled ALIGNMENT SYSTEM FOR SEMICONDUCTOR MANUFACTURING APPARATUS also assigned to TRE Corporation, the assignee of the present application. A further object of the present invention is to provide an automated technique for recognizing a wafer alignment pattern even with minimal difference in intensity from the background.

SUMMARY OF THE INVENTION

These and other objectives are achieved by the inventive automatic wafer alignment technique which is implemented by a digital control system cooperating with the alignment optics, a video camera and wafer table drive mechanism of a step-and-repeat microphotolithographic exposure system. The present system accepts as an input the digitized data obtained from the video camera used to view the combined image of the wafer alignment target and the reticle alignment window. The system provides drive commands to the X-, Y- and rotational drive mechanisms which move the table or "stage" that holds the wafer.

In the prealignment phase, the inventive system controls the search for the first global target. When this is located and verified as being an actual target, the system searches and locates a second global target. Advantageously, these global targets are selected to be close to the wafer center line and near opposite peripheral edges of the wafer. Once located, the system uses the determined positions of these global targets to calculate and correct for any rotational error and/or lateral offset of the wafer. During the step-and-repeat exposure operation, the system likewise identifies and locates the wafer target at each die site, and controls the necessary table movement to accomplish perfect die alignment.

The search technique is designed to minimized the time required to find each global target. This is done by searching over a rectilinear search area in which the most likely expected locations for the global target are searched first, and the less likely locations are searched last.

The inventive technique for target recognition includes an "edge extractor" program which first locates the edges of each feature visible in the video image along the X- or Y- axis. The locations of these edges are categorized and stored in a "data buffer".

Using the information in this data buffer, a "reticle locator" program determines which if any of the edges present in the video display correspond to edges of the alignment window on the reticle or mask. Further analysis is done only with respect to edges which are visible "within" this reticle window.

Next, a "target identifier" program is used to determine whether any pairs of the edges visible in the video scan within the reticle window have the proper spacing and other characteristics to be a "potential" target. These potential targets are identified and listed in a "target buffer".

A "select best target" program then is used to determine which of the potential targets listed in the target buffer is most likely to correspond to the actual wafer alignment target. Certain criteria such as the intensity of the target image, the width (i.e., the distance between edges) of the target and the similarity or dissimilarity of the edge amplitudes are used to determine which pair of edges most likely represents the actual wafer target. These separate criteria may be differently weighted in the determination, and, during the die-by-die alignment process, may be statistically improved by accumulating target characteristics over a plurality of successive targets on the wafer.

The selected "best target" designates the feature within the video image which is most likely to be a portion of a true wafer alignment target. When searching for the global targets, the inventive system next uses a "verify target" process to confirm that the video camera is indeed viewing an actual alignment target. In the preferred system, the wafer alignment target takes the configuration of a cross with an elongated horizontal arm and a relatively shorter vertical arm. A verification scheme is carried out in which the wafer is moved to several successive locations along the horizontal axis so that the video camera can view different portions of the assumed target. These include a central location at which both the horizontal and vertical bars of the target should be visible, positions spaced from the vertical bar such that only a portion of the horizontal bar should be visible and portions spaced sufficiently far from the vertical bar that no part of the wafer alignment target should be visible. The assumed target is verified as being an actual target if and only if the expected target features (or absence of the same) are detected at every one of the target confirmation viewing zones.

BRIEF DESCRIPTION OF THE DRAWINGS

FIG. 6 is a chart showing the major steps in the overall wafer alignment and exposure process.

FIGS. 7, 8 and 9 are flow charts of the "search" program used to direct searching for the first global target.

FIG. 15 illustrates typical contents of the "data buffer" for a single axis.

FIG. 16 illustrates typical contents of the "edge buffer" which contains a listing of the edges ascertained by the edge extractor program of FIGS. 12A and 12B.

FIG. 19 illustrates the typical contents of the "targer buffer" established by the target identifier program of FIG. 18, such contents identifying the potential targets evident in a video display such as that of FIG. 4.

FIG. 21 is schematic representation of the search procedure used by the program of FIG. 21 to verify the target.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention, since the scope of the invention best is defined by the appended claims.

Figure 1:
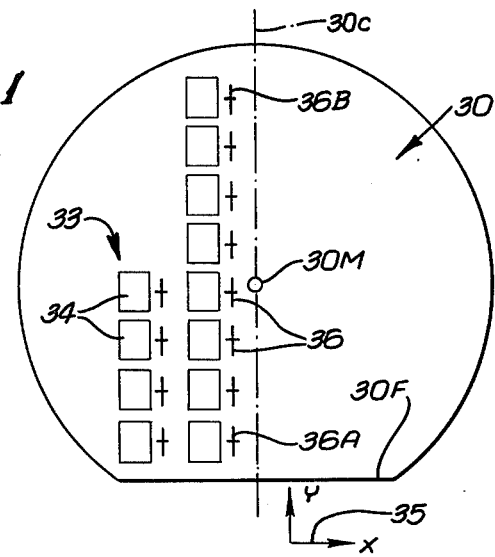
FIG. 1 is a top plan view of a semiconductor wafer having a plurality of die sites and a wafer alignment target at each such site.
Figure 2:
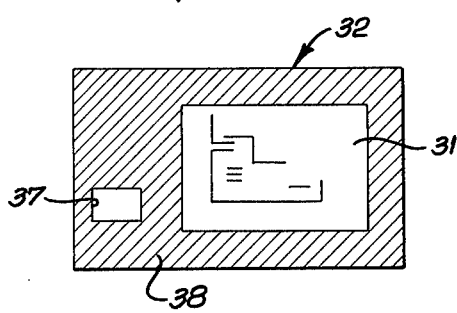
FIG. 2 is a plan view of a mask or reticle used at the second (B-level) or subsequent semiconductor processing step, and containing an alignment window.

In a step-and-repeat microphotolithographic exposure system, a semiconductor wafer 30 such as that shown in FIG. 1 is repeatedly exposed to the image of a circuit pattern 31 from a mask or reticle 32 such as that shown in FIG. 2. An initial (A-level) reticle is used to expose onto the wafer 30 an array 33 of pattern images 34, typically one at each die site. Advantageously, the array 33 is formed by stepping the wafer 30 through fixed distances parallel to the X and Y axes (illustrated by the arrows 35) of the exposure apparatus and making a single reticle exposure at each die site.

To facilitate automatic alignment in accordance with the present invention, during this A-level mask exposure process, a wafer alignment target 36 also is exposed onto the wafer 30 at each die site. As shown in FIG. 1, these targets 36 may be situated in the alleys between columns of patterns 34 along which alleys the wafer 30 is ultimately scribed and severed into individual circuit chips.

Figure 3:
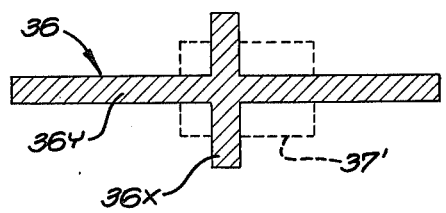
FIG. 3 illustrates the preferred shape and size (relative to the reticle window) of a wafer alignment target used with the present system.

Advantageously, each wafer alignment target 36 has the cross-shaped configuration shown in FIGS. 1 and 3. It includes a relatively long arm 36Y which extends on the wafer 30 generally along the system Y-axis direction. Accordingly, the arm 36Y will be referred to herein as the "Y-bar". In a typical embodiment, this Y-bar 36Y may be 8 mils long.

The alignment target 36 also includes a relatively shorter (typically 3 mils) crossbar 36X at the center of the Y-bar 36Y. This "X-bar" is generally aligned on the wafer 30 in the direction of the system X axis. As a result of the conventional first step processing of the wafer 30 which follows exposure to the A-level mask, the alignment targets 36 are physically formed within the wafer 30, and may be manifest e.g., as diffusion regions within the semiconductor wafer.

The second (B-level) and each subsequent mask has the generally appearance of the reticle 32 (FIG. 2). This includes the pattern 31 which must be repeatedly exposed onto the wafer 30 in perfect alignment with the previous pattern 34. To accomplish this in accordance with the present invention, each reticle 32 is provided with a transparent, rectangular alignment window 37 surrounded by an opaque region 38. If projected onto the wafer surface 30 through the system exposure lens, the reduced image of the alignment window 37 typically may have the dimensions of 2.8 mils along the Y-axis and 2.2 mils along the X-axis, as indicated by the broken line 37' in FIG. 3.

Alignment is achieved at each die site by projecting a low intensity light source (advantageously as the same wavelength as that used to perform the circuit exposure) through the reticle 32 and through the main exposure lens system onto the wafer 30. The light intensity is sufficiently low so that there is no exposure of the photoresist coating the wafer 30. The projection lens is telecentric, so that the light reflected back from the wafer 30 again passes through the window 37 of the reticle 32. This light is viewed through appropriate optics by a video camera. The resultant video image has the general appearance shown in FIG. 4 in which the horizontal scan of the video camera is generally aligned with the system Y axis. What is seen is the reflected image 36' of the wafer alignment target 36 and the silhouette 37' of the reticle alignment window 37 which is transilluminated by light reflected from the wafer 30.

Advantageously, the output of the video camera is digitized. For example, during each video sweep, a set of digital values may be obtained which represent the intensities of the image at successive picture element ("pixel") locations. Typically, there may be 256 scan lines, with the intensity being digitized during each sweep at each of 256 column or sample point locations. Thus for a complete video image there is one data sample point for each of 256×256 picture elements or "pixels".

For utilization in the present invention, the sample point intensity values are averaged for each column and for each row. Thus two sets of data are obtained. These are illustrated by the dotted curves 40 and 41 in FIG. 4. The first data set (curve 40) consists of 256 digital values each representing the average intensity of the image detected during a corresponding video sweep or scan line. This data is stored in a section of a random access memory identified as a "data buffer". FIG. 15 shows the general contents of such data buffer. Each sample point (i.e., each scan line) is indentified by a corresponding index value 0,1,2 ... 255 corresponding to the like numbered scan line in FIG. 4. The average intensity ($V_0$, $V_1$, $V_2$ etc.) for each scan line also is stored in digital form in the data buffer. As evident from curve 40, in the illustrative embodiment of FIG. 4 this average intensity will be least in the border regions where the light is blocked by the opaque portion of the reticle 32 surrounding the window 37. The intensity will be greater within the alignment window opening, and will be greatest along those scan lines at which the Y-bar image 36Y' is present (assuming a higher reflectivity of the target 36 than the surrounding area on the wafer 30, which is not always the case). A similar but separate buffer area in memory stores the average intensities at each column position, as represented e.g., by the dotted curve 41 of FIG. 4.

The overall wafer alignment and exposure process which takes place for each of the B-level and subsequent masks is summarized in FIG. 6. The wafer 30, already containing the alignment targets 36, is roughly oriented so that its centerline 30C is approximately parallel to the system Y-axis. With this rough $\theta$ alignment, the wafer 30 is moved onto the stage (block 42 of FIG. 6). Next, an air jet sensor is used (step 43) to detect the flat edge sector 30F of the wafer 30. A closer $\theta$ alignment of the wafer 30 is obtained by reference to the detected flat 30F. The air jet sensor then is used (block 44) to detect two edge points on the wafer 30, and from this information to determine the location of the center 30M of the wafer 30.

Figure 5:
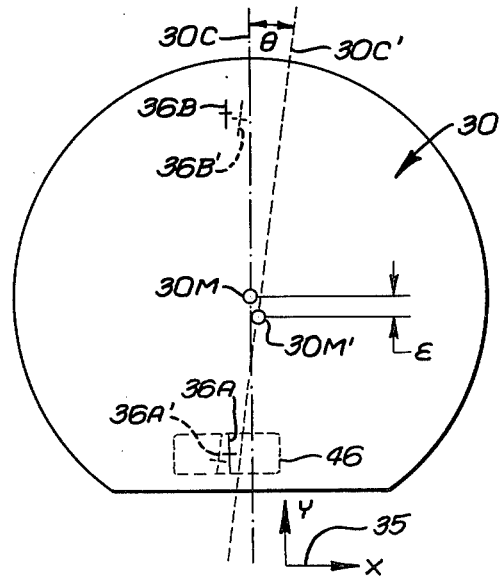
FIG. 5 is a top plan view of a semiconductor wafer, like that of FIG. 1, but showing the location of the global targets in the event of rotational error and lateral offset of the wafer after preliminary rough alignment.

At this point the wafer 30 has been prealigned on the stage. Typically, however, there will still be some rotational ($\theta$) alignment error and/or lateral offset error of the center 30M. This rough prealignment error is illustrated in FIG. 5 wherein the broken line 30C' illustrates the actual rotational orientation of the wafer 30 centerline with respect to the system Y axis. This rough alignment 0 error is generally less than about two or three minutes. Typically, the lateral offset error $\epsilon$ of the wafer will be less than 2 mils. That is, the actual center 30M of the wafer will be offset by $\epsilon$ from the position determined in the rough prealignment process (block 44).

It is at this point that the present invention comes into play. Initially, (block 45 of FIG. 6) a search is carried out to locate the first global target 36A. The search is under computer control using the programs of FIGS. 7, 8 and 9. The area which is searched on the wafer is shown by the broken line 46 in FIG. 5, and also is shown in enlarged form in FIG. 10. As discussed above in connection with FIGS. 2, 3 and 4, the area on the wafer 30 which can be viewed by the video camera at one time is approximately 2.2 mils ×2.8 mils, corresponding to the dimensions of the reticle window 37 as projected onto the wafer 30 surface. Thus the entire search region 46 cannot be viewed all at once by the video camera. The zone 46 thus must be searched by moving the wafer 30 in some order and viewing different portions of the zone 46 successively.

Figure 10:
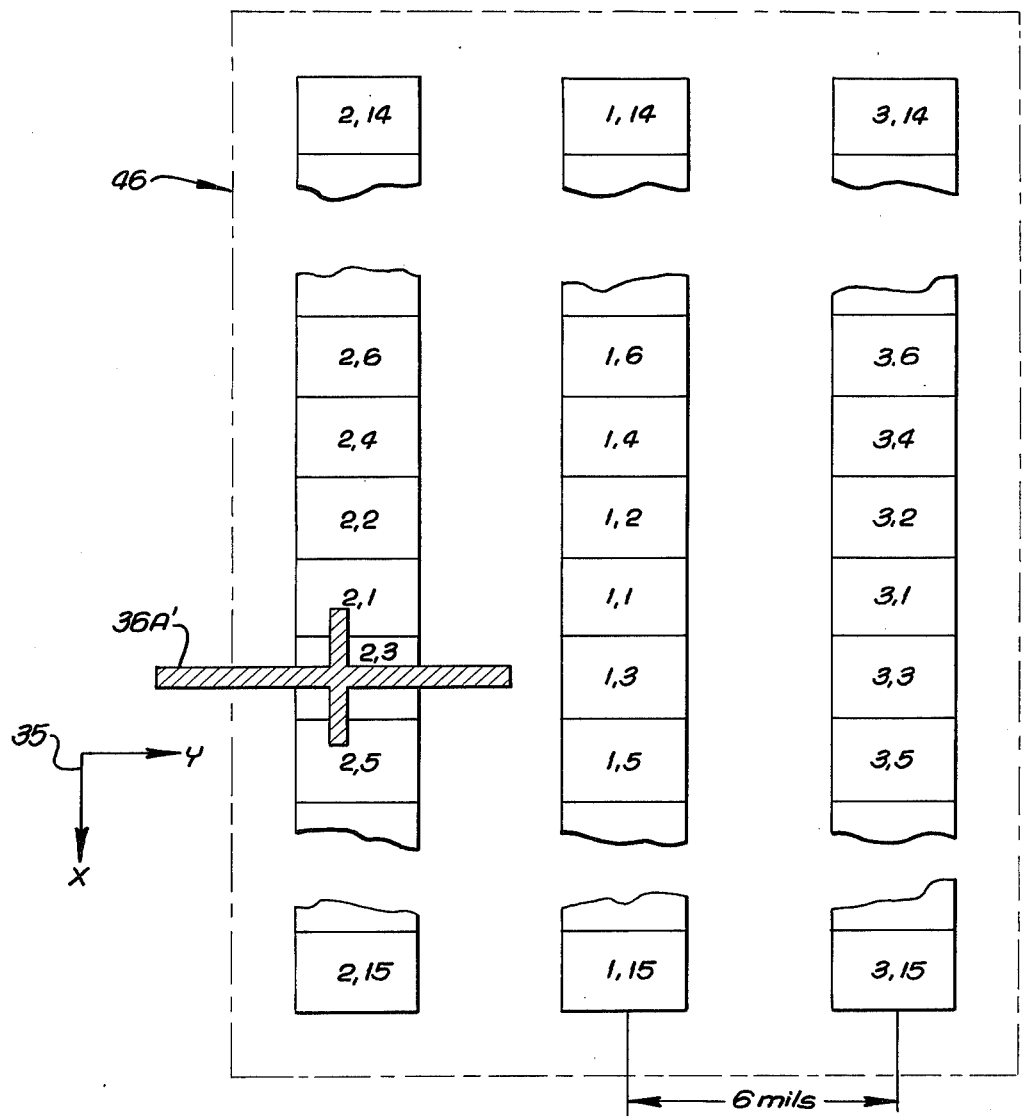
FIG. 10 is a diagrammatic view of the region of the semiconductor wafer of FIG. 5 which is searched (by the "search" program) to locate the first global target, the view also showing the order of search.

To minimize the time required to locate the first global target, the zone 46 is searched in the order illustrated in FIG. 10. The locations at which the target 36A is most likely to be present are searched first, the lower probability locations are searched later. Accordingly, the search begins at location 1,1 (FIG. 10) at which the center of the first global target 36A would be located if there were no rotational or lateral offset error in prealigning the wafer 30. Since a rotational ($\theta$) error in prealignment will offset the target 36A primarily along the system X axis, the next locations searched are those which lie parallel to the X axis in line with the initial location 1,1. As evident in FIG. 10, the next position (designated 1,2) that is searched is immediately adjacent to the location 1,1 but offset to the left (as viewed in FIG. 5) along the X axis. If the target is not found there, the position 1,3 next is searched. This position is offset to the right along the X axis with respect to the initial position 1,1. The search then proceeds alternately to the left and to the right (along the X axis) at positions 1,4 then 1,5 then 1,6 through position 1,15. The distance of the position 1,15 from the initial search location 1,1 generally corresponds to the maximum X-axis offset of the target 36A which would occur with the maximum expected wafer rotational $\theta$ error.

If the target is not found along the first line of search, it is probably because a lateral offset error $\epsilon$ exists which would shift the position of the target in the direction of the system Y axis. Thus a portion of the zone 46 is next searched that is offset from the initial postion in the −Y direction. Again the search begins at a position at which there is no 0 error, designated by the position 2,1 in FIG. 10. The search progresses alternatively to the left and to the right at consecutive positions 2,2 then 2,3 through 2, 15. If the target still is not found, a third row in the zone 46 is searched which is offset in the +Y direction with the respect to the initial search location. The search proceeds at positions 3,1 through 3,15 as shown in FIG. 10.

Advantageously, the search rows in the zone 46 are separated by a distance (typically 6 mils) that is less than the length of the Y-bar 36Y. In the embodiment of FIG. 10, the search would terminate when the first global target 36A' is detected at search location 2,3.

Referring again to FIG. 6, once the first global target has been located, a prediction can be made as to the location of the second global target 36B. The distance between the global targets 36A and 36B on the wafer 30 is known, and the particular location in the search zone 46 at which the first global target is found gives an indication of the actual $\theta$ and $\epsilon$ errors. A search (block 47) of FIG. 6 then is undertaken to locate this second global target, using the same type of search scheme set forth in connection with FIG. 10.

When both of the global targets have been found, an accurate calculation of the $\theta$ and $\epsilon$ errors is made, (block 48). The stage is rotated to correct for the $\theta$ error, and moved parallel to the Y axis to correct for the lateral offset error $\epsilon$. The wafer 30 then is accurately aligned as shown in FIG. 1. A step-and-repeat exposure operation is carried out, with the wafer being moved appropriately along the X- and/or Y-axes between each die site (block 49). Target alignment may be carried on a die-by-die basis.

Figure 7:
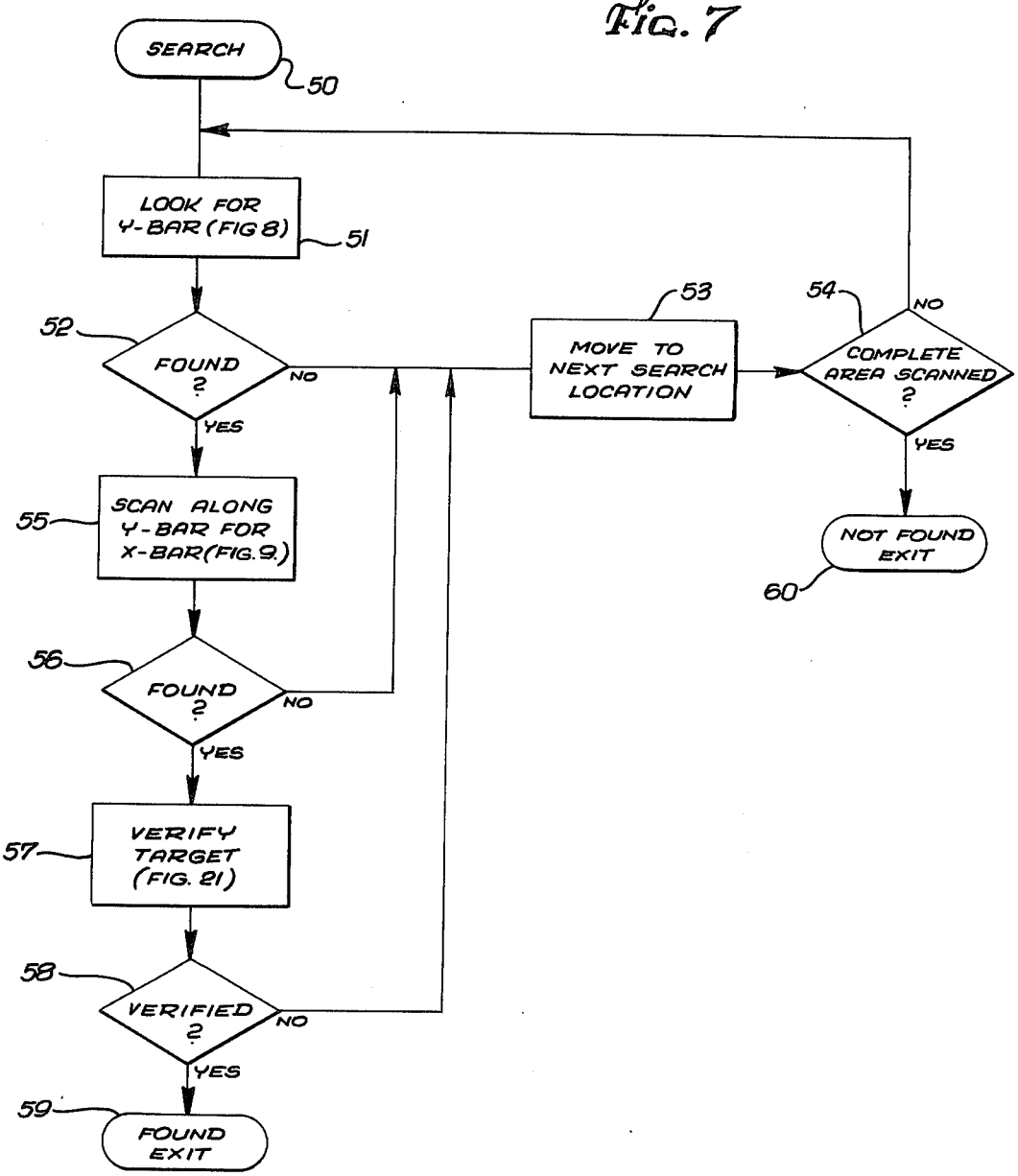

The search for the first global target is carried out under control of the SEARCH program 50 of FIG. 7. Initially, the stage X-Y drive mechanism is used to move the wafer 30 so that the location 1,1 (FIG. 10) is viewed by video camera. The resultant image data (i.e., scan line average intensity and column average intensity) is loaded into the corresponding data buffers. Utilizing the stored scan line intensity values, a program (block 51) called "LOOK FOR Y-BAR" is carried out to determine if a portion of the Y-bar 36Y is visible in the video image. This program is detailed in FIG. 8.

A determination is made (block 52, FIG. 7) as to whether a Y-bar has been found. If not, the wafer is moved (block 53) to the next search location. In the exmaple of FIG. 10, since no Y-bar would be seen at search location 1,1 the wafer next would be moved to location 1,2. A check then is made as to whether the complete area 46 has been scanned (block 54). If not, the program branches back to block 51 to look for the Y-bar at this next search location. This loop will be repeated for consecutive search locations until a Y-bar is located. In the example of FIG. 10, this will occur when searching the location 2, 3.

When this occurs, the YES output from block 52 will be followed, and the system will scan along the Y-bar to look for the X-bar (block 55). This operation is detailed in FIG. 9 and uses the search order illustrated in FIG. 11. If an X-bar is found (as tested at block 56) a procedure is carried out (block 57) to verify that the detected feature is actually an alignment target. This is done using the VERIFY TARGET program described below in connection with FIGS. 21 and 22.

A determination is made (block 58) that the target has actually been verified. If so, a "found" exit 59 is taken, since the first global alignment target now has been found and its location is known. In the event that no X-bar is detected (at block 55), or the feature is not verified as a target (at block 57), the program loops back to block 53. Either situation indicates that the video camera is viewing some feature on the wafer surface which is not a true alignment target. Accordingly, the wafer is then moved to the next search location (block 53) and the search process is reiterated. If the global target is not located after the entire area 46 has been scanned, the SEARCH program 50 terminates at the "NOT FOUND" exit 60. Typically this may result in rejection of the wafer 30.

The LOOK FOR Y-BAR program 61 is detailed in FIG. 8. This program utilizes scan line intensity information (FIG. 4) stored in the data buffer (FIG. 15). From this information it creates a list of all of the feature edges that are visible along the system X-axis. This list is compiled in a region of memory called an "edge buffer", the typical contents of which are illustrated in FIG. 16. Creation of this edge buffer is accomplished by the "edge extractor" program of FIGS. 12A and 12B.

Figure 4:
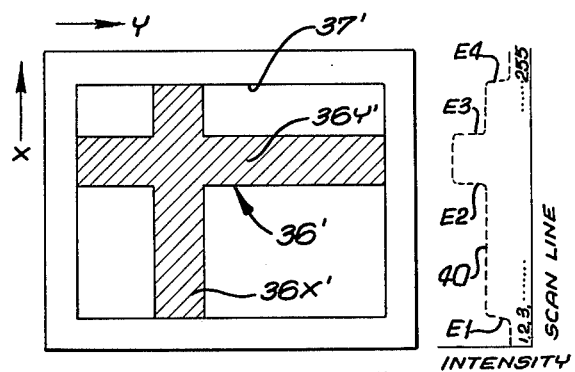
FIG. 4 illustrates a typical view of the superimposed wafer alignment target and reticle alignment window as seen through the alignment optics by a video camera, and also illustrates the corresponding data values representing the average intensity for each vertical row and horizontal column of the video display.

In the embodiment of FIG. 4, there are four edges evident along the X-axis. These are the left edge E1 of the reticle window, the left edge E2 of the Y-bar 36Y', the right edge E3 of the Y-bar and the right edge E4 or the reticle window. Thus (at block 62, FIG. 8) use of the EDGE EXTRACTOR program will create in the edge buffer (FIG. 16) a list of the four edges E1–E4 (FIG. 4).

Next (block 63), a LOCATE RETICLE program (described in FIG. 17) is used to determine which of the edges evident in the video display correspond to the image of the reticle alignment window 37. In the example of FIG. 4, this program will determine that the edges E1 and E4 correspond to the reticle window.

Figure 18:
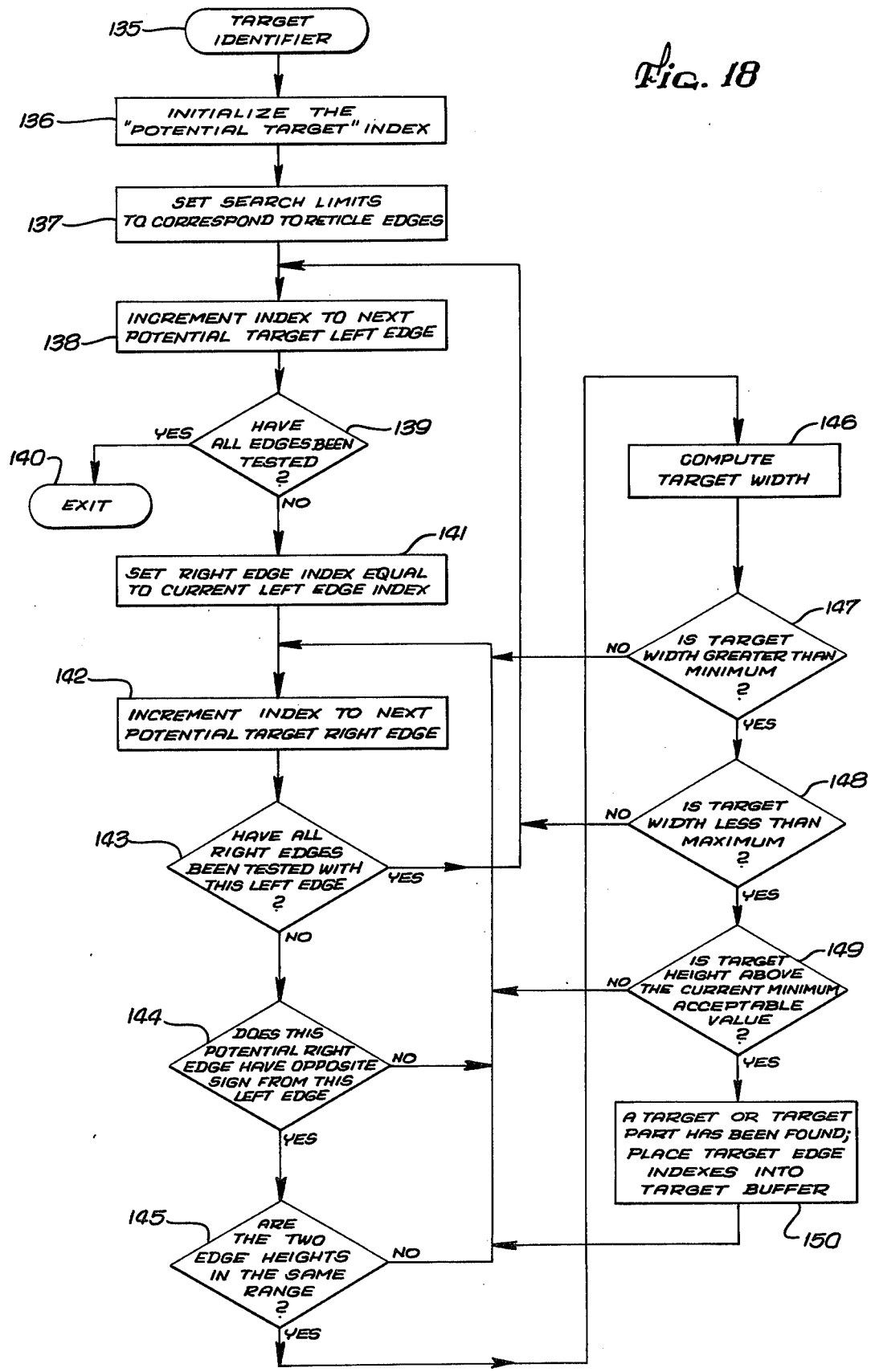
FIG. 18 is a flow chart of the "target identifier" program used to identify which of the edges located by the edge extractor program of FIGS. 12A and 12B correspond to potential targets.

Next (block 64), all of the features evident in the vide image within the reticle window will be analyzed to determine if any are potential targets. This is carried out by the TARGET IDENTIFIER program of FIG. 18, which refers to the edge information contained in the edge buffer (FIG. 16). The TARGER IDENTIFIER program establishes, in a memory region called a "target buffer", a list of potential targets. Typical contents of a target buffer are shown in FIG. 19. A determination then is made as to whether at least one potential Y-bar target exists (bock 65). If not an exit 66 is taken (and the program returns to block 53, FIG. 7).

If at least one Y-bar potential target exists, a determination is made (block 67) of which potential target is most likely to represent the actual wafer alignment target. This determination is carried out by the SELECT BEST TARGET program of FIG. 20. Once selected, the exact position of each target edge (e.g., edges E2 and E3 of FIG. 4) is ascertained (block 68, FIG. 8). The distances of these edges (E2, E3) from the reticle window edges (E1, E4) then are computed. The program then returns via the "Y-bar found" exit 69 to block 55 of FIG. 7.

Figure 9:
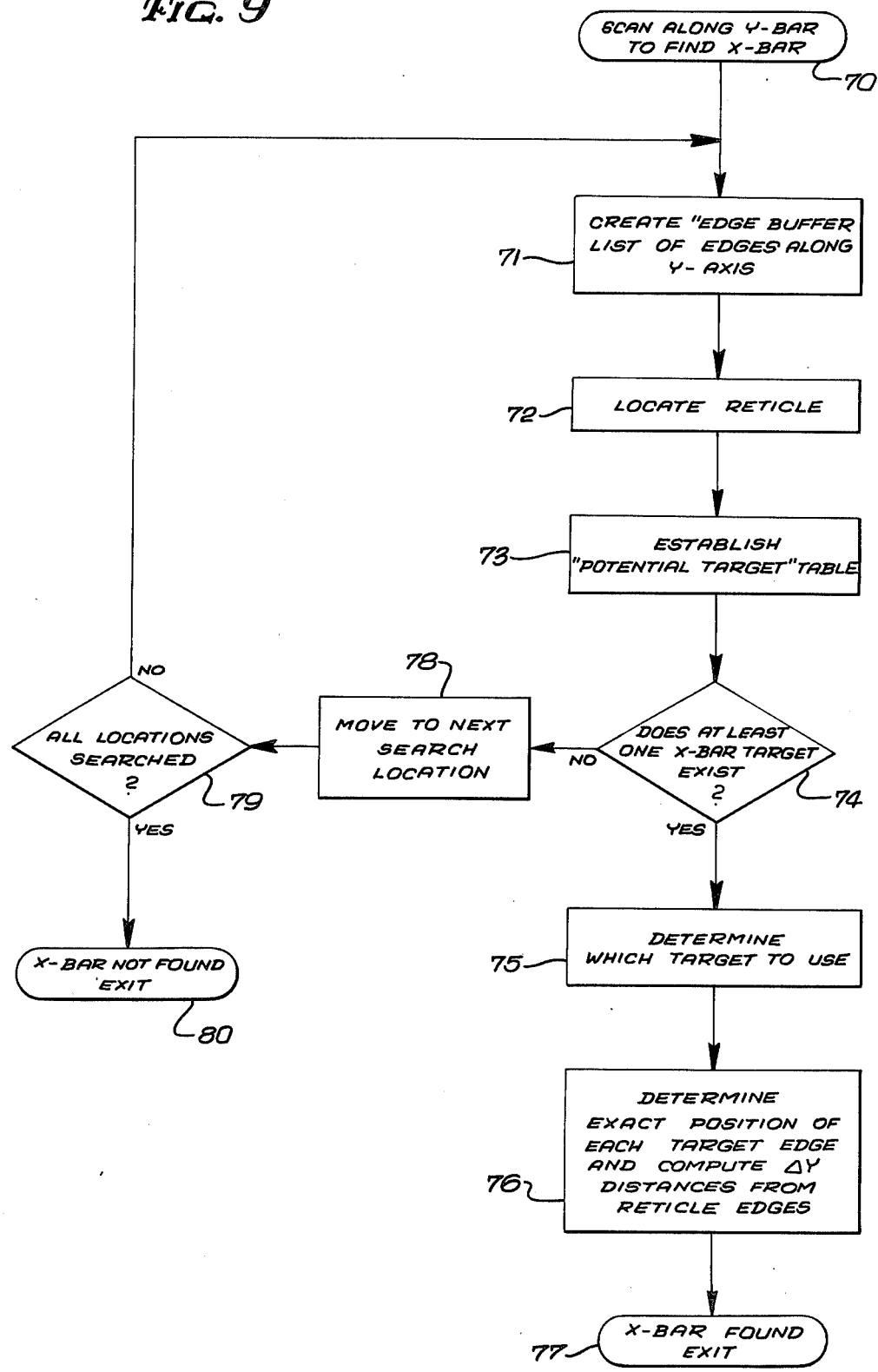

Since a Y-bar has now been found within the video image, a scan is made along the Y-bar to find the X-bar using the program 70 of FIG. 9. This program uses the average column intensity information represented by the dotted curve 41 of FIG. 4 and stored in a corresponding column intensity (y-axis) data buffer having contents similar to that of FIG. 15.

Initially (block 71, FIG. 9) this Y axis information is used to assemble an edge buffer list of edges evident along the Y axis. In the embodiment of FIG. 4, the edges F1 through F4 would be listed. The EDGE EXTRACTOR program is used for this purpose.

Next the reticle is located (block 72) using the RETICLE LOCATOR program. This is followed by a creation of a target buffer containing a list of potential targets along the Y axis, using the TARGET IDENTIFIER program (block 73). If at least one potential X-bar target is evident in the video image (as determined at block 74), a determination (block 75) is made as to which target is most likely to represent the actual X-bar. The SELECT BEST TARGET program is used for this purpose. The exact position of each target edge (e.g., the targets F2 and F3 in FIG. 4) is determined and the distances of these edges from the reticle edges (F1 and F4 in FIG. 4) is determined (block 76). The program then returns via the "X-bar found" exit 77 to block 57 of FIG. 7.

Figure 11:
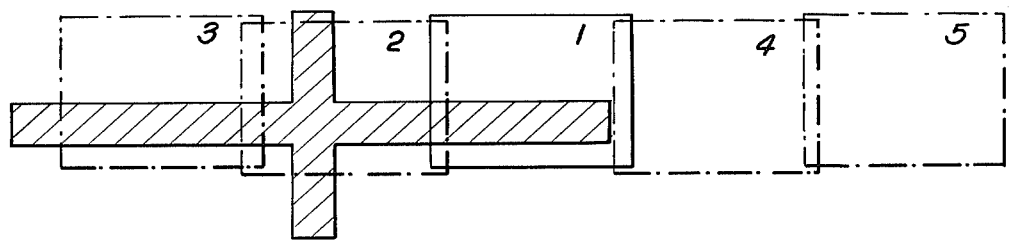
FIG. 11 is a diagrammatic view showing the order of scanning to find the vertical arm (X-bar) of the alignment target, as carried out under direction of the "scan" program illustrated in FIG. 9.

If no potential X-bar target is evident in the video image, the wafer 30 is moved to the next search location along the X-bar (block 78). The order of search is illustrated in FIG. 11. If the X-bar is not found at the initial position 1 viewed by the video camera, the wafer 30 is moved in the +Y direction by a distance (typically 2.6 mils) slightly less than the width of the projected reticle window 37. A determination is made (at block 79) as to whether all locations have been searched. If not, the operations of blocks 71, 72 and 73 are repeated at the new location. In the example of FIG. 11, the X-bar will be found at this second search location.

If not found, the search continues with the wafer being moved to the relative locations 3, 4 and 5 illustrated in FIG. 11. Each of the locations 1 through 5 is spaced along the system Y-axis by a distance just less than the projected width of the reticle window 37. The search progresses first in one direction (to the left in FIG. 11) at three consecutive locations (1, 2, 3) and then to the right at two consecutive locations (4, 5). Since this SCAN program 70 only is initiated when a potential Y-bar feature has been detected, searching at these five locations (1–5) along the X-axis will be sufficient to locate the X-bar if the originally determined feature is indeed part of an actual wafer alignment target. If that feature is not to be part of an actual alignment target, no X-bar will be found at any of the positions 1–5, and the SCAN program 70 will be exited via the "X-BAR NOT FOUND" exit 80 back to block 53 of FIG. 7.

Figure 21:
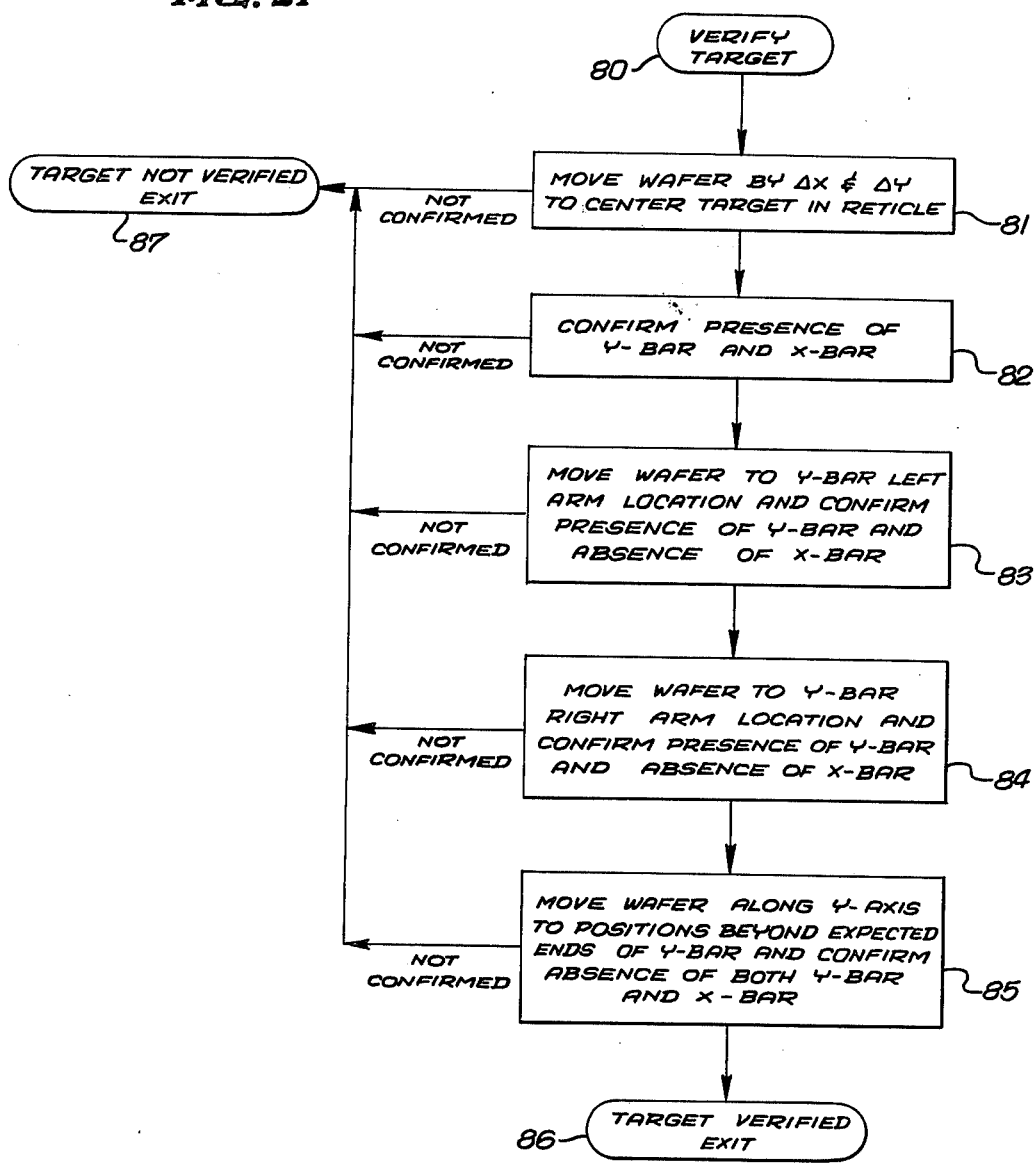
FIG. 21 is a flow chart of the "verified target" program which is used to confirm that the feature visible in a video display such as that of FIG. 4 is an actual wafer alignment target.

Referring again to FIG. 7, in the event that an X-bar has been detected along the Y-bar (blocks 55 and 56), the VERIFY TARGET program 80 of FIG. 21 is used to verify that an actual wafer alignment target is being viewed by the video camera. When this program 80 is entered, the image viewed by the video camera will be similar to that shown at the position 2 in FIG. 11 with both the X-bar and Y-bar evident but not centered with respect to the reticle window. Since the edge locations of the X-bar and Y-bar are specified in the appropriate target and edge buffers, the distances of these edges from the reticle window edges readily can be computed. This is done, and the results are used to direct movement of the stage by appropriate distances along the X and Y axes so as to center the target with respect to the image of the reticle window (block 81, FIG. 21). Next, the presence of both the Y-bar and the X-bar in the new video image is confirmed (block 82) using the EDGE EXTRACTOR, RETICLE LOCATOR, TARGET IDENTIFIER and SELECT BEST TARGET programs. Since the image should have the appearance of that shown at 1' in FIG. 22, both the Y-bar and X-bar components should be found.

Target verification continues (block 83) by moving the wafer in the +Y direction by a distance (approximately 2.4 mils) at which only the left end of the Y-bar will be evident in the video image if an actual wafer target is present. The video camera then should see the view 2' shown in FIG. 22. The presence in the resultant video image of the Y-bar and the absence of the X-bar then are confirmed (block 84). The wafer is then moved in the −Y direction to a location 3' (FIG. 22) at which only the right end of the Y-bar should be evident in the video display. Again, the presence of the Y-bar and absence of the X-bar are confirmed.

Figure 22:
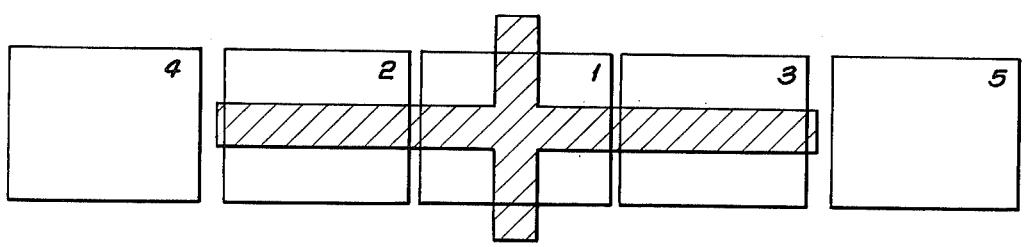

Next the wafer is moved by a sufficient distance so that the video camera will view the area of the wafer just beyond the left end of the Y-bar, as shown at 4' in FIG. 22. The absence of both the Y-bar and the X-bar in this image then is confirmed (block 85). The wafer is then moved in the −Y direction so as to view the area just beyond the right end of the Y-bar, at the position 5' of FIG. 22. Again, the absence of both the Y-bar and X-bar are confirmed.

In this manner, the program 80 (FIG. 21) verifies that the item being viewed is an actual wafer alignment target. The verification is made (FIG. 22) by confirming the presence of both X- and Y-bars at the central location and the presence of only Y-bar elements at the positions 2' and 3', and confirming the absence of any feature just beyond (positions 4' and 5') both ends of the Y-bar. If all tests are met, the program 80 terminates at the "target verified" exit 86 which returns to the "found" exit 59 of the SEARCH program 50 of FIG. 7. In the event that any of the tests (blocks 82–85) do not provide confirming results, the program returns via the "target not verified" exit 87 to the block 53 of FIG. 7.

The foregoing procedure usually will result in location of the first global target. When this location is known, the location of the second global target 36B (FIG. 1) readily can be predicted. (See block 47 of the overall wafer alignment and exposure process of FIG. 6.) A search for the second global target then is carried out using the SEARCH program 50 of FIG. 7. Advantageously, this search begins at the predicted location, so that the search location 1,1 of FIG. 10 will correspond to this predicted location. All of the programs described above are repeated to locate and verify the second global target 36B.

Once accurately located, the rotational error $\theta$ and lateral offset error $\epsilon$ (FIG. 5) are corrected (block 48, FIG. 6). The step-and-repeat exposure process is then carried out (block 49). An alignment can be carried out at each die site using the programs disclosed herein. At each site it is most likely that the individual alignment target will be within view of the video camera when the wafer is stepped to that position. Therefore, use of the SEARCH program 50 should not be required at each die site. However, the EDGE EXTRACTOR, RETICLE LOCATOR, TARGET IDENTIFIER and SELECT BEST TARGET programs would be used to determine accurately and precisely the exact location of the individual target with respect to the reticle window, and thereby allow precise determination of the extent to which the wafer must be moved to correct for any positioning error. The reticle 32 will thereby be accurately aligned so that the image of the pattern 31 (FIG. 2) will be exposed in exact registration with the prior exposure at the same die site on the wafer.

Figure 12A:
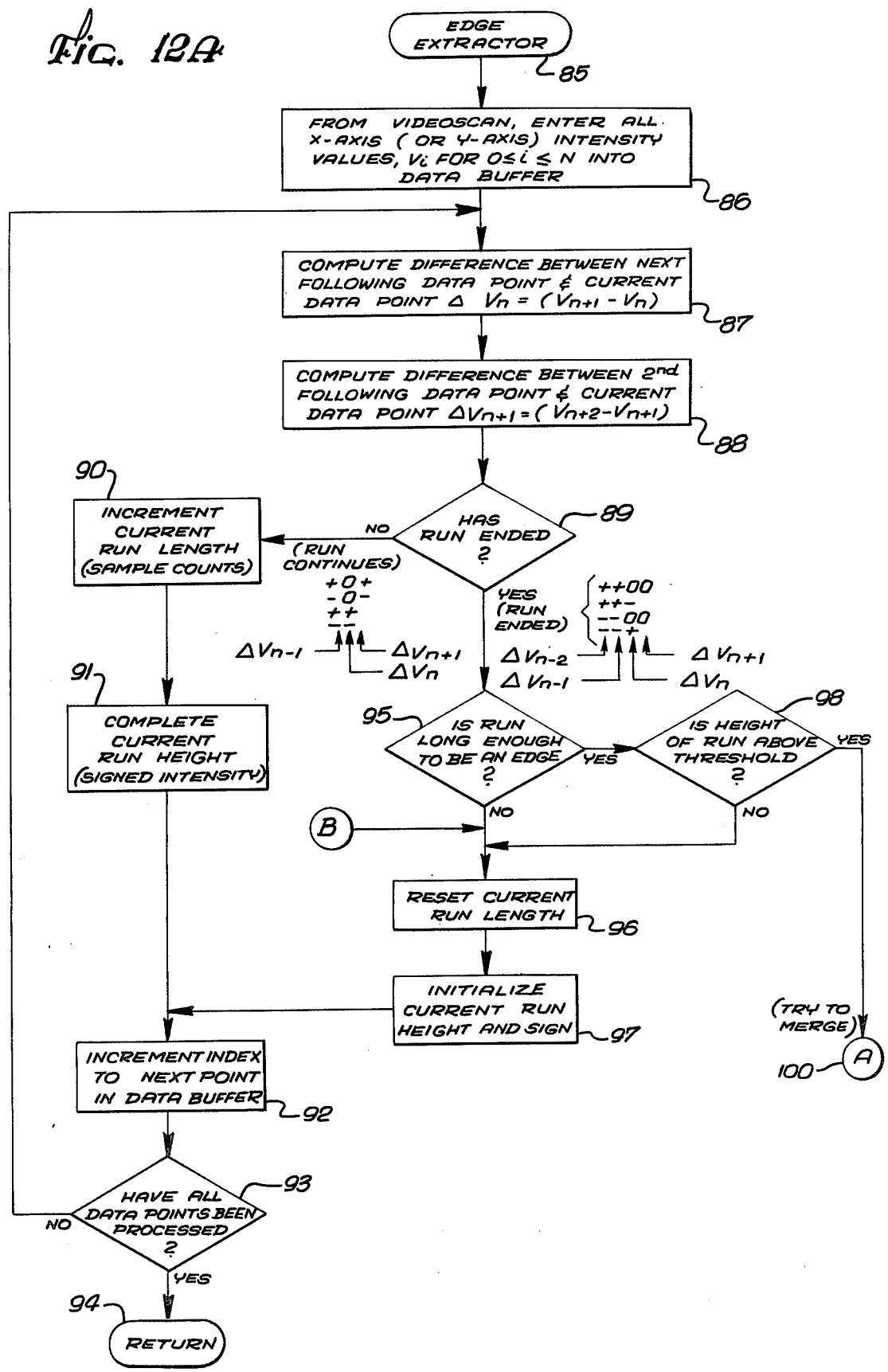
FIGS. 12A and 12B comprise a flow chart of the "edge extractor" program which is used to determine each of the edges visible in a video display such as that shown in FIG. 4.
Figure 12B:
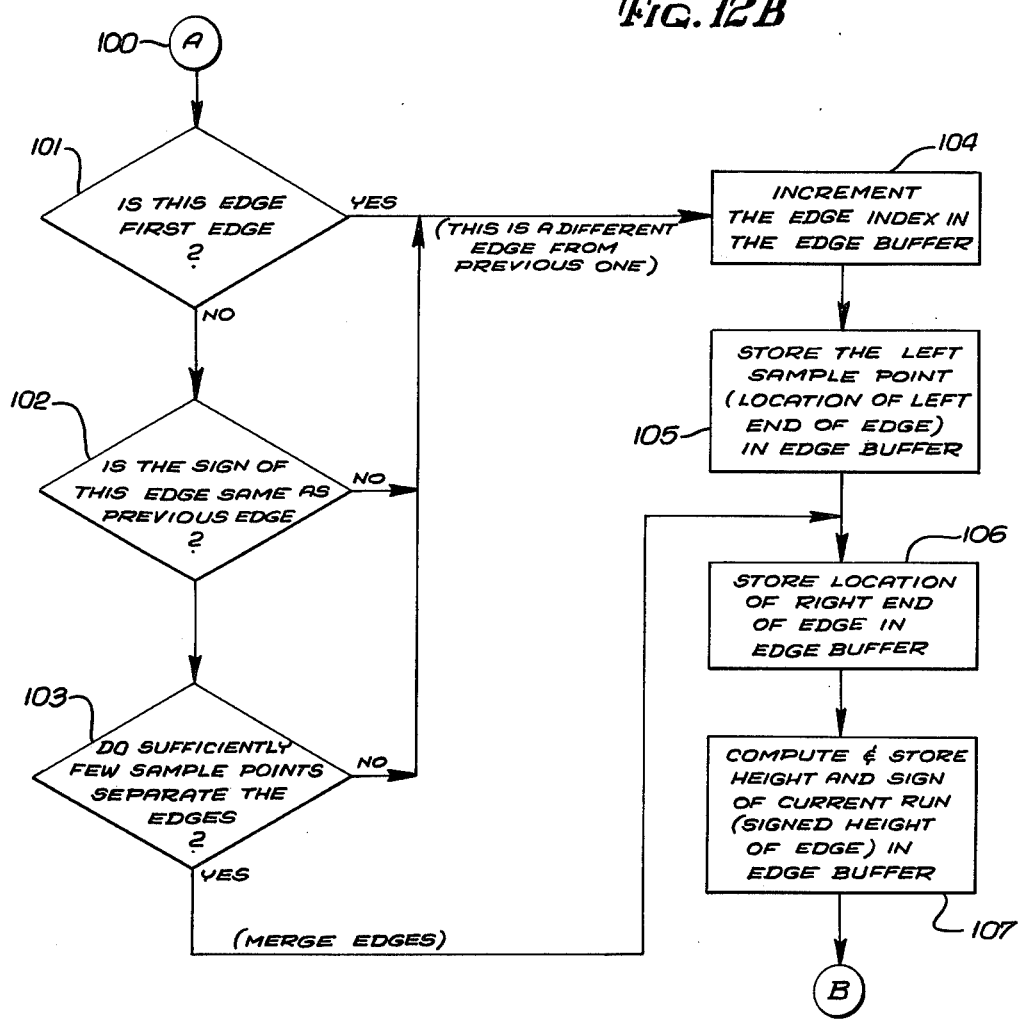

The EDGE EXTRACTOR program 85 of FIGS. 12A and 12B is used to locate all of the edges which are visible along one or the other of the axes of the video image (FIG. 4). The following description will be made with reference to location of the edges along the X-axis (corresponding to the edges E1–E4 in the typical embodiment of FIG. 4). Operation of the EDGE EXTRACTOR program to determine the edges along the Y-axis (F1–F4 of FIG. 4) is the same, except that the column average intensity levels (curve 41) would be used instead of the scan line average intensity values (curve 40).

Initially (block 86, FIG. 12A) the X-axis average intensity values $V_i$ for $0 \leq i \leq N$ for all video scan lines 0 through N=255 (for the example where there are 256 lines) are loaded into the X-axis data buffer (FIG. 15). An index n is initialized to point to the first data entry (scan line n=0). A loop is then entered in which the differences in intensity for successive sample points or scan lines is computed. From these differences in intensity, a determination is made as to whether these points are part of a visible edge.

The difference between the next data point (n+1) and the current data point n is computed (block 87) to obtain the value $\Delta V_n = (V_{n+1} - V_n)$. This value is stored in the "intensity difference" column of the data buffer FIG. 15). The sign of this stored value $\Delta V_n$ indicates whether the intensity has increased (+) or decreased (−) in value from the preceding point. At block 88 a "look ahead" now is done by computing the intensity difference between the next (n+1) data point and the data point (n+2) following that. This signed difference $\Delta V_{n+1}=(V_{n+2}-V_{n+1})$ is used (block 89) to determine if a run of points representing a potential edge has ended.

If two consecutive intensity differences $\Delta V_{n-1}$ and $V_n$ have the same sign (both + or −) it is assumed that the corresponding points are part of the same edge, and the "run continues" path is taken to block 90. If the current intensity difference $\Delta Vn$ is zero but the last intensity difference $\Delta V_{n-1}$ was either + or −, the "look ahead" next intensity difference $\Delta V_{n+1}$ is considered. If it is non-zero and has the same sign as the prior intensity difference, it is also assumed that the run has not ended, and the "run continues" path again is taken to the block 90.

Two criteria are used to determine that a run has ended. The first is that the sign of the current intensity difference $\Delta V_n$ is opposite from the sign of the prior two intensity differences in the run. For example, if the preceding two intensity differences $\Delta V_{n-2}$ and $\Delta V_{n-1}$ both were + and the current intensity difference $\Delta V_n$ has a − sign, the run has ended and block 89 is exited via the path to block 95 (FIG. 12A). A second criteria indicating that a run has ended occurs when both the current intensity difference $\Delta V_n$ and the "look ahead" intensity difference $\Delta V_{n+1}$ both are zero. In this case the "run ended" path to block 95 also is taken.

A tally is kept (block 90, FIG. 12A) of the current run length (i.e., the number of scan lines or sample points in the current run). This value is incremented each time the block 90 is entered. The current run height then is computed (block 91). This height is the accumulated sum of the signed intensity differences $\Delta V_n$ for all of the data points in the current run. The index n then is incremented (block 92) to designate the next sample point in the data buffer. A determination is made (block 93) as to whether all of the data points have been processed. If not, the program loops back to block 87 and the next intensity difference is investigated. If all data points have been processed, the program terminates at the exit 94 and returns e.g., to block 63 of FIG. 8 for execution of the RETICLE LOCATOR program.

If the run has ended, a determination is made (block 95) as to whether the run is long enough to be an edge. The minimum edge "length" will be established as a system criteria. Typically at least three consecutive points are required to indicate the presence of a potential edge feature in the image viewed by the video camera. If the run is not long enough to be an edge, an exit is taken to blocks 96 and 97 at which the current run length counter and the current run height accumulator both are reset to zero. The program loops back to block 92 for consideration of the next data point.

In the event that the run is long enough to be an edge, a determination is made (block 98) as to whether the overall height of the run is above a certain threshhold. The current run height (established at the block 91) is compared with a certain threshhold that is preestablished as the minimum height value for categorizing a feature in the video image as being a potential edge. If the run height is not above threshhold, the program loops back (via blocks 96, 97, 92 and 93) to evaluate the next data point. If the run height is above threshhold a potential edge has been detected and the exit route A is taken to a subroutine 100 shown in FIG. 12B. This subroutine 100 determines whether or not the current run is of the same sense (i.e., positive going or negative going) as the previously detected edge. If it is of the same sign, and if it is sufficiently close to the previous edge (i.e., separated by sufficiently few data points from) the current run is considered to be an extension of that previous edge, rather than a separate and independent edge. In this instance, the current run is merged with the previously detected edge. This is illustrated in FIG. 14B and described below.

In the subroutine 100, a determination first is made (block 101) as to whether this is the first detected edge along the axis being investigated. If so, the merger tests are not performed and the program jumps to block 104. If this is not the first edge, a determination is made (block 102) as to whether the sign of this run is the same as the previous edge. If not, no merger is performed and the program continues at block 104.

If the sign is the same, a further determination is made (block 103) as to whether sufficiently few sample points separate the current run from the previously detected edge. For example, the criteria could be established that for merger, the present run must be separated by only one sample point from the end of the previous edge. If too many sample points separate the edges, no merger takes place, and the program continues at block 104. The present run then is considered to be a different edge from the previous one. However, if sufficiently few sample points separate the edges, the current run is considered to be part of the previous edge, and a merger does take place, beginning at block 106.

Figure 14A:
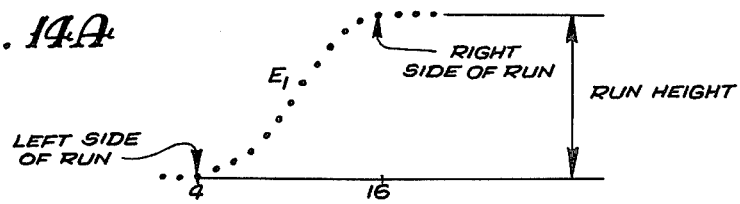
FIGS. 14A and 14B illustrate typical intensity values at successive data points within an edge of a feature viewed by the video camera.
Figure 14B:
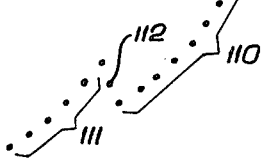

FIG. 14B illustrates a situation in which the current run 110 would be merged with the previous edge 111. Both of these are of the same (+) sign. They are separated by only a single data point 112. Thus it is most likely that the run 110 represents a continuation of the same edge feature in the video display, and accordingly a merger of the runs 110 and 111 is accomplished (by not executing the operations of blocks 104 and 105), so that these two runs are characterized as a single edge.

In the event that the current run is either the first edge or a different edge from the previous one, an edge index in the edge buffer is incremented (block 104, FIG. 12B). This index value designates the ordinal number (1, 2, 3 ...) of the edge currently being evaluated. Next (block 105) the location of the left end of the edge is stored in the edge buffer (FIG. 16). This left end location is identified by the corresponding sample point index value n from the data buffer (FIG. 15). In the example of FIG. 4, the left-most edge visible along the X-axis is the edge E1. This edge will be identified in the edge buffer by the index number "1". If the left end of this edge E1 begins at sample point n=4, the value "4" will be entered into the "left end location" column of the edge buffer (FIG. 16). Next the location of the right end of the edge is stored in the edge buffer. In the example of FIGS. 4 and 14A the right end of the edge E1 ends at sample point n=16 and this value "16" is stored in the edge buffer.

The overall height and sign of the current edge next is stored (block 107) in the edge buffer. This value corresponds to the run height computed at block 91 if the current run was not merged with the prior run, and corresponds to the sum of the value in the current run height counter and the height of the previously determined edge in the event that the current run is merged with the previous edge. The program then returns via the path B to blocks 96 and 97 (FIG. 12A) where the run length and run height counters are reset prior to investigation of the next data point in the data buffer.

When the EDGE EXTRACTOR program 85 is completed, the edge buffer (FIG. 16) will contain a list of all of the edges visible in the video image. At this point, the overall program may return to block 63, FIG. 8. The RETICLE LOCATOR program 115 of FIG. 17 then is used to determine which of the edges listed in the edge buffer constitute the edges of the reticle window 37.

Figure 17:
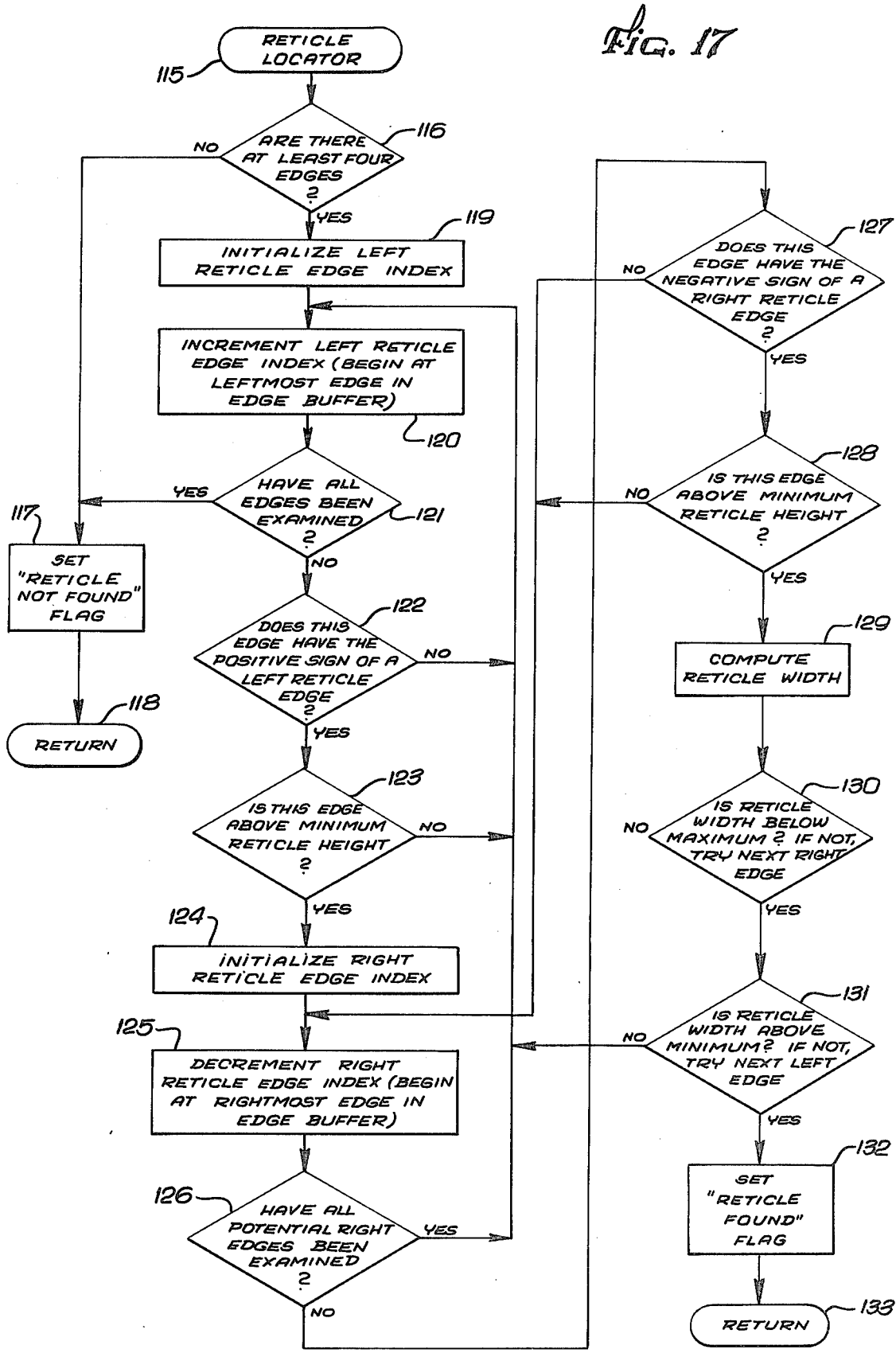
FIG. 17 is a flow chart of the "reticle locator" program used to ascertain the position of the reticle edges that are evident in a video display such as that shown in FIG. 4.

Referring to FIG. 17, a determination initially is made (block 116) by reference to the highest index number in the edge buffer to detemine if there are at least four edges visible in the video image. This is the least number of edges that would be evident if both the reticle window image 37' and a portion of the Y-bar both were present. If at least four edges are not present, a "reticle not found" flag is set (block 117) and the program returns (block 118) to block 53, FIG. 7 to advance the wafer to the next search location.

If sufficient edges are present, a "left reticle index" is establishd and initialized to zero (block 119). This index then is incremented (block 120) to "1". The value of this left reticle edge index will correspond to one of the edge number indices in the edge buffer. At the first entry of block 120, the value "1" will point to the leftmost edge "1" listed in the edge buffer. This edge is most likely to be the left edge (E1 in FIG. 4) of the reticle window image 37'.

If all edges have not been examined (as tested at block 121), a test is made to determine if this edge (identified by the reticle edge index) has the requisite positive sign of a left reticle edge (block 122). Since light of greater intensity should enter the video camera within the interior of the reticle window image 37', the left edge E1 will have a positive sign. If the edge does not have this sign, the program loops back to block 120 and the left reticle edge index is incremented to the next edge. If the edge currently being evaluated does have the requisite positive sign, a determination next is made (block 123) as to whether this edge is above minimum height for a reticle edge. This test is made by comparing the edge height (from the edge buffer, FIG. 16) with a threshhold or minimum value that is preestablished as a system criteria. If the edge is not above minimum height, the program again returns to the block 120 and the left reticle edge index is incremented. If the edge is above minimum reticle height, it is assumed that the left reticle edge now has been located, and that the current value of the left reticle edge index indentifies this left edge.

A search is now undertaken (beginning at block 124) to locate the right reticle edge. This begins by initializing a right reticle edge index to a value that is one greater than the maximum edge number index value in the edge buffer. Each remaining edge visible along the X-axis in the video image, beginning with the rightmost visible edge (E4 in the example of FIG. 4) is tested to determine if it could possibly be the right edge of the reticle window.

Initially (block 125) the right reticle edge index is decremented. The first time this block is entered, the index will point to the right-most edge (which has the highest index number) in the edge buffer. A check is made (at block 126) to determine if all potential right edges have been examined. If the decremented right reticle edge index now corresponds in value to the current left reticle edge index, no potential right edge for the reticle window yet has been found. The program then loops back to block 120, and the next left-most edge is tried as the potential left reticle window edge. This is done by incrementing the left reticle edge index (block 120) and repeating the steps 121 through 126.

If all of the potential right edges have not been examined, the block 126 is exited to the block 127. A determination is made (by reference to the edge buffer) as to whether the edge identified by the current right reticle edge index has the appropriate negative sign of a right reticle edge. If not, the next potential right reticle edge is tested by branching back to the block 125.

If the curent right edge does have the correct negative sign, a further test is made (block 128) to determine if this edge is above a minimum threshhold height for a reticle edge. If not, the next potential right reticle edge is tested by branching back to block 125. If the edge is above minimum height, the reticle width is computed (at block 129). That is, the difference in location between the two edges designated by the current right and left reticle edge indices is computed. Two tests are made (at blocks 130 and 131) to determine if the computed reticle width is below a certain maximum value and above a certain minimum value. That is, a test is made to determine if the reticle window image 37', as represented by the current left and right reticle edge indices, is within the range expected in view of the known width dimension of the reticle window 37. If too wide, the program branches back to block 125 and the next potential right reticle edge (which will be closer to the left reticle edge) is tested. If the reticle width is too narrow, the program branches back to block 120, and the next (in the rightward direction) left reticle edge is tested.

If the computed reticle width is within range, a "reticle found" flag is set (at block 132). The program then returns (block 133) e.g., to block 64 of FIG. 8. When this occurs, the current values of the left and right reticle edge indices point to those two edges in the edge buffer (FIG. 16) which correspond to the edges of the reticle window image. In the example of FIG. 4, these would correspond to the edges E1 and E4.

The TARGET IDENTIFIER program 135 (FIG. 18) next may be used to determine which pairs of the remaining edges listed in the edge buffer constitute potential targets. This is done by testing each edge pair to determine if they have the requisite opposite signs (i.e., one positive and one negative), and to determine that their separation is commensurate with the expected width of a target feature (e.g., that the width corresponds to the width of the Y-bar image 36Y' as illustrated in FIG. 4). A list of such potential targets is established in a target buffer (FIG. 19).

Initially (block 136, FIG. 18) a "potential target" index is initialized to zero. This index will represent the ordinal number of each potential target to be listed in the target buffer (FIG. 19). Next, (block 137) the search limits are set to correspond only to those edges listed in the edge buffer (FIG. 16) which lie between those edges that correspond to the reticle window. The potential target left and right edges are identified by a corresponding pair of indices that are initialized at block 137. This initialization can be accomplished by setting the potential target left and right edge indices initially to correspond to the values of the reticle left and right edges.

The next potential target left edge index is incremented at block 138. The first time this block is entered, the index will be incremented to point to the left-most edge that is within the reticle window image. If all edges have been tested (block 139) the program exits (block 140), for example to block 67 of FIG. 8, and the "SELECT BEST TARGET" program is entered. If all edges have not been tested, the right edge index is set equal to the current left edge index (at block 141) and is then incremeted (block 142) to point to the next potential target right edge. If all right edges have been tested with the current left edge (as determined at block 143), the program loops back to block 138 and the next potential left edge is tested. If all right edges have not been tested, the program continues at block 144. There, a test is made to determine if this potential right edge has the opposite sign from the current left edge. If the two edges are of the same sign (both positive or both negative) they cannot together represent a potential target. Therefore, the program loops back to block 142 so as to try the next potential right edge.

If the edges are of opposite sign, a test is made (block 145) to determine if the two edges are similar in height. Normally the target image will be such that the two edges will have "heights" within the same range, of for example, 50% of one another. If the edges are of substantially different height (e.g., one more then twice the height of the other), it is assumed that the two edges do not belong the same feature. Accordingly, the program branches back to block 142 and the next right edge is tested.

If the two edge heights are within the same range, a computation is made (block 146) as to the target width. That is, the locations of the left and right edges identified by the current left and right edge indices are obtained from the edge buffer, and utilized to determine the width between these edges.

A pair of tests (blocks 147 and 148) are made to determine whether the target width is within the expected range, which range would correspond e.g., to the width of the Y-bar image 36Y' in FIG. 4. If the target width is less than minimum, the current right edge is too close to the current left edge. Accordingly, the program branches back to block 142 to test whether the next right edge is a potential target edge. If the target edge is greater than maximum, the program branches back to block 138 and the program is repeated using the next (rightward) edge as the next potential target left edge.

If the target edge is within acceptable range, a determination is made (at block 149) as to whether the absolute target height is above a minimum acceptable value. In other words, it is expected that the image of the wafer alignment target 36 will be above a certain intensity value. If the intensity of the feature represented by the current left and right edge indices is below this minimum value, it is assumed that the observed feature is not the wafer alignment target, even though the edges are of appropriate width separation. In such instance the program loops back to block 142 and proceeds to test the next potential target right edge.

If the target intensity is satisfactory, a target or target part has been found. The current target left and right edge indices are placed (block 150) into the targer buffer (FIG. 19). These edge indices point to the corresponding edges listed in the edge buffer (FIG. 16). The program continues (by branching back to the block 142) until all potential targets have been identified. At that point, the program is exited at block 140.

Upon competion of the TARGET IDENTIFIER program 135, the target buffer (FIG. 19) will contain a list of the pairs of edges evident in the video display which represent potential targets. The SELECT BEST TARGET program 155 (FIG. 20) then is used to select that one potential target (i.e., that one pair of edges) which is most likely to correspond to the actual wafer alignment target 36. A target index keeps track of which potential target in the target buffer currently is being evaluated.

Figure 20:
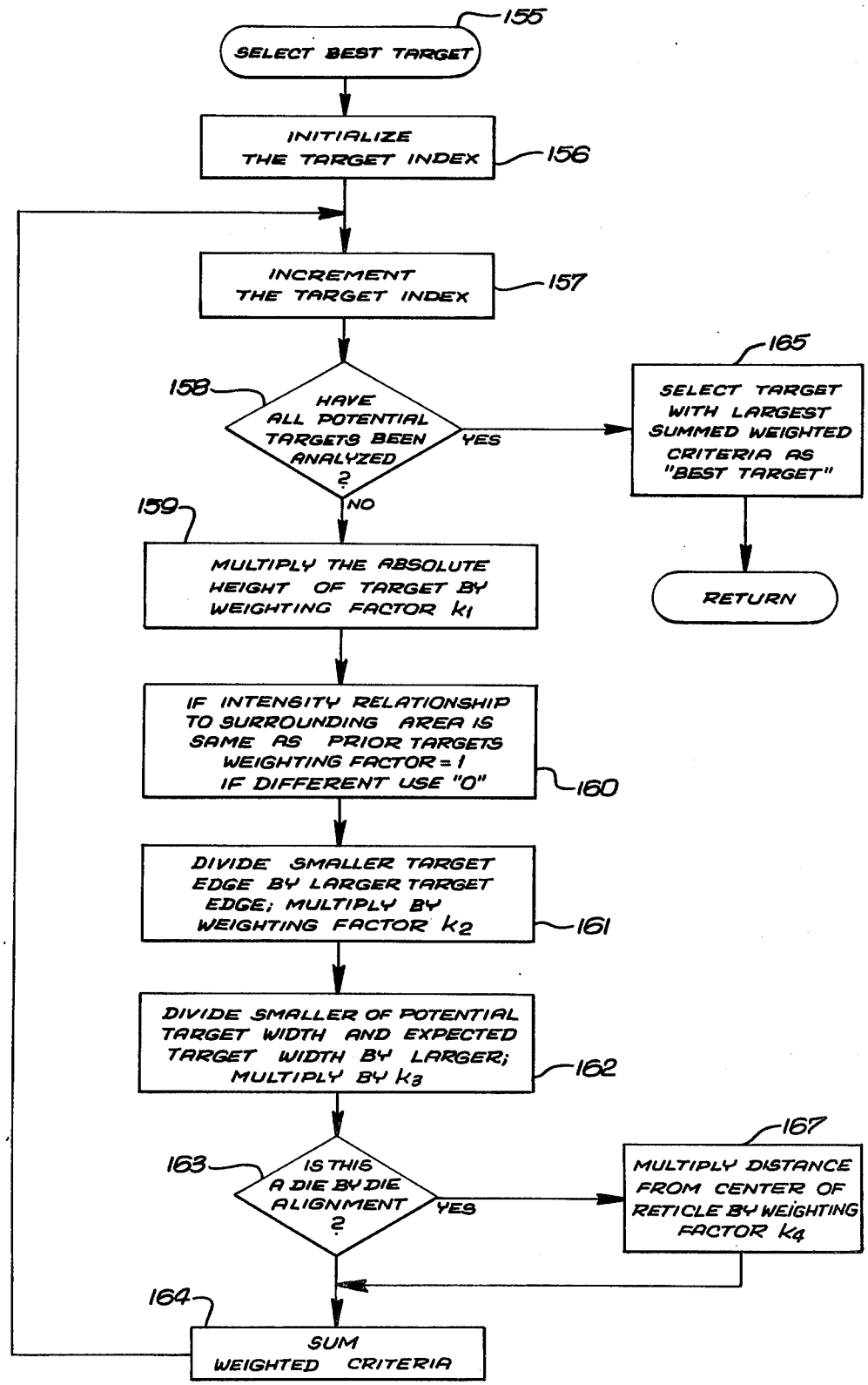
FIG. 20 is a flow chart of the "select best target" program that determines which of the potential targets listed in the target buffer is most likely to represent the actual wafer alignment target.

Initially this target index is set to zero (block 156, FIG. 20). The target index is then incremented (block 157) so that on the first iteration the potential target "1" is evaluated. A test is made (block 158) to determine if all potential targets have been analyzed. If not, certain parameters of the potential target are examined. These are weighted by appropriate weighting factors that represent the relative importance of the particular parameter in determining which is the best target.

One such parameter is the absolute height (i.e., average intensity) of the target. This is weighted by multiplying the height by a first factor $k_1$ (block 159).

Whether the intensity of the particular target is greater than or less than the surrounding light intensity level is another factor which is considered. In the example of FIG. 4, the Y-bar 36Y' is brighter (i.e., of greater absolute height) than the surrounding region. If this is true of the first global target 36A, the other targets 36 on the wafer 20 most likely will also exhibit such greater absolute height. Thus if a potential target were later detected which had an absolute height that was less than the surrounding area, such potential target is not likely to be an actual wafer alignment target. This criteria is taken into account (at block 160) by utilizing a weighting factor of "1" if the height relationship of the potential target is the same as that of prior targets, and by using a weighting factor of "0" if the height relationship is opposite. During the search for the first global target 36A, the weighting factor "1" is always used.

Another criteria is the degree of similarity between the heights of the two edges in the potential target. If these two edges (such as the edges E2 and E3 in FIG. 4) are very similar in height, it is more likely that they result from the same target feature than if the two edges differed substantially in height. This criteria is taken into account by dividing (at block 161) the smaller target edge height by the larger target edge height, and mutiplying the quotient by a weighting factor $k_2$.

The width of the potential target also is considered (block 162). The smaller of (a) the width of the potential target and (b) the expected width of the actual target image, is divided by the larger of these. The quotient is multiplied by a weighting factor $k_3$.

A measure of the relative merit of the current potential target is obtained by summing the weighted criteria obtained at blocks 159 through 162. First, a test is made (block 163) to determine if this is a die-by-die alignment. If not, (e.g., if this is a search for the first global target), the weighted criteria are immediately summed (block 164).

The progam then loops back (to block 157) and repeats this evaluation process for each of the remaining potential targets. When all have been tested, the program will branch from block 158 to block 165, and the best target will be selected. In the embodiment illustrated, that potential target which has the largest value of summed weighted criteria will be selected as the best target. The program then returns (via the exit 166) e.g., to the block 68 of FIG. 8 for determination of the exact position of each target edge with respect to the reticle edges.

If a die-by-die alignment is being performed, it is expected that, when the wafer is stepped to each successive die site, the image of the alignment pattern at the new site will be quite close to the center of the video display. Thus if the potential target is not close to the center, it is less likely to represent the actual wafer alignment target. This nearness-to-center criteria is utilized by the program 155 when performing a die-by-die alignment. A weighting factor $k_4$ is divided (block 167) by the distance of the potential target from the center of the reticle. This weighted criteria then is included in the summation (at block 164) that obtains the summed weighted criteria by means of which the best target is selected.

The particular weighting factors $k_1$ through $k_4$ are system criteria which may be selected by experience. In general, it has been found that during the intital search for the first global target 36A, the absolute height (i.e, intensity) of the target is the most important criteria. Thus during such global target search, the weighting factor $k_1$ may have a larger value than the weighting factors $k_2$ and $k_3$. On the other hand it has generally been found that during a die-by-die alignment, the distance of the potential target from the reticle center becomes the most important criteria. Thus during such die-site alignment, the weighting factor $k_4$ may have the greatest value.

Certain of the criteria may be improved statistically in the course of a die-by-die alignment of a particular wafer, or may be improved as successive wafers are processed at the same reticle level. For example, the actual target widths of each successive target image 36' may be stored and averaged. Thus when a particular die site alignment is performed, the width of each potential target may be compared (at block 162) with the actual average width of all of the previously detected targets. Similarly, the absolute height (i.e., intensity) of each of the previously detected targets 36 may be stored and averaged. The height of each potential target then may be compared (block 159) with this actual average value.

Figure 13:
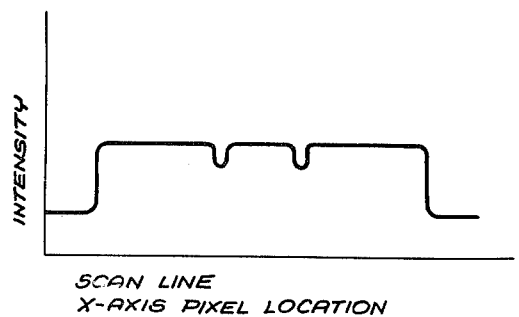
FIG. 13 shows a typical set of data values representing the average intensity of the image viewed by the video camera along each video scan line.

The use of such statistically accumulated values to obtain the weighted criteria used for best target selection is particularly useful during those processing steps (i.e., reticle levels) at which the actual alignment target 36 is difficult to distinguish from the background. This situation is illustrated by FIG. 13, which shows a curve 170 of intensity values as a function of scan line (similar to the curve 40 of FIG. 4). Six edges G1 through G6 are evident. The edges G1 and G6 correspond to the reticle window image 37'. The edge pairs G2, G4 and G3, G5 correspond to two potential targets. (In actuality, they may both correspond to the actual wafer alignment target 36). Here the main portion of the image 36' of the Y-bar has the same absolute height (i.e., average intensity) as the surrounding area. In this example, the borders of the Y-bar image 36' have a darker appearance (lower intensity) than the surrounding region. This results in the apparent edges G2 through G5 of FIG. 13.

With this type of video image, a particular criteria such as the target width may become predominant as the determining feature for selecting the best target. In that case, the corresponding weighting factor (such as $k_3$) may be chosen to have the largest value when performing best target selection at this reticle level. This is particular true at the reticle level at which the wafer 30 is covered with a metalization or highly reflective material. In such case, the intensity of every feature on the wafer, as viewed by the video camera, may be essentially the same. Thus the absolute height would not be a good or important criteria for determining whether a potential target feature corresponds to the actual alignment target.

Thus use of the inventive wafer alignment technique permits automatic alignment of each wafer 30 within the step-and-repeat microphotolithographic exposure system, permits automatic die-by-die alignment during the exposure processing.

What is claimed is:

1. A method for use in a system in which a video camera is used to view a target of expected characteristics, said method being used for ascertaining whether a feature evident in the video image corresponds to the actual target, said video camera providing output data consisting of an average intensity value for each scan line or column of said video image, comprising:
    ascertaining, from said video data, each feature edge evident in the video display,
    sequentially correlating the data for each ascertained edge with the data for each other ascertained edge to determine all pairs of edges which represent potential targets, and
    selecting the best target by weighted comparison of selected parameters of all determined pairs of edges.

2. The method of claim 1 comprising the initial step of:
    entering into a "data buffer" memory a list of the average intensity value for each scan line or column of said video image and the signed difference in intensity value between consecutive ones of said scan lines or columns, said ascertaining being accomplished by reference to said data buffer memory.

3. The method of claim 2 wherein said ascertaining comprises:
    determining from the values stored in said data buffer memory the presence of each run of consecutive scan lines or columns for which the intensity differences between consecutive points all are of the same sign or zero, but in which no two or more consecutive intensity differences are zero, each such run representing an edge, and
    establishing in an "edge buffer" memory a list of all such edges including the scan line or column at which each such edge run begins and ends, and of the total intensity difference between the beginning and end of each such edge run.

4. The method of claim 3 wherein said ascertaining further comprises:
    determining for each edge run whether it is of the same sign as the immediately preceding edge, and if so, of further determining whether the beginning of said each edge run is separated from the end of said immediately preceding edge by less than a certain small number of scan lines or columns, and, if so,
    listing said each edge run and said immediately preceding edge in said edge buffer memory as a single edge beginning at the starting point of said immediately preceding edge and ending at the end of said each edge run.

5. The method of claim 3 or 4 wherein said correlating to determine potential targets comprises:
    determining those pairs of edges, listed in said edge buffer memory, for which the edges are of opposite sign and have run heights that are within a certain range of one another, and that are separated from one another by a width that is within a certain preselected range, and establishing in a "target buffer" memory a list of all pairs of edges that meet such criteria, each such pair representing a potential target.

6. The method of claim 5 wherein said selecting comprises:
for each potential target listed in said target buffer memory, establishing a set of weighted criteria each consisting of a parameter selected from the group consisting of absolute intensity of the potential target, ratio of the two edge heights of said potential target, width of said potential target, and relationship of intensity of potential target to the intensity of the surrounding area of said video image, each such parameter being weighted by a corresponding weighting factor,
algebraically combining all of the weighted criteria for each potential target, and
selecting as the best target that potential target having the optimum value of combined weighted criteria.

7. A method for determining the location of edges of features evident in a video image sensed by a video camera, comprising:
obtaining for each video scan line or column a digital value representing the average intensity along such scan line or column,
comparing, for each such scan line or column, the intensity value of that scan line or column with the intensity value of each the next two successive scan lines or columns, thereby to obtain a first intensity difference between said each scan line or column and the next one following and a second intensity difference between said each scan line or column and the second next following one,
determining from (a) the intensity difference between said each scan line or column and the next preceding scan line or column, and from (b) said first and second intensity differences, that the preceding, each and next scan lines or columns belong to a potential edge, by using the criteria that, for a potential edge, the signs of such preceding and first intensity differences are the same, or that said first intensity difference is zero and the signs of the said preceding and second intensity differences are the same, and
determining the end point of such edge by the criteria that an edge ends when two consecutive intensity differences are zero, or that the sign of one intensity difference is the opposite of the sign of the preceding two intensity differences.

8. A method for use in a wafer alignment system employed with a wafer processing apparatus in which a semiconductor wafer is to be aligned in a certain orientation with respect to the reference axes of said system, said wafer containing at least one alignment target designated as a global alignment target, the wafer being roughly prealigned to within certain rotational error and lateral offset error tolerances, and in which a small region of the wafer is viewed by a video camera for alignment purposes, the method being used for searching for said global target, comprising:
first positioning said wafer so that said video camera views a first area thereon at which said global target would be located if the wafer were correctly positioned, and determining from the output of said video camera if the global target is visible at said area,
thereafter moving said wafer alternately in one direction and the opposite direction along the system axis closest to that along which the target would be displaced as a result of rotational error in rough positioning, by amounts increasing in each such direction by steps corresponding to the dimension in that direction of the region viewed by said video camera, such being repeated until the distance searched in each direction from said first area is substantially equal to the expected maximum offset of said target which would result if the rough alignment were to have said maximum expected rotational error, and determining from said vidio camera output, at each such location, if said global target is visible at such location, and
thereafter repeating such moving and determining first along one then along another of two paths parallel to the initial movement path but laterally offset therefrom by respective positive and negative amounts corresponding to the expected maximum lateral offset error of said wafer, and
terminating such search at the location at which said alignment target is visible by said video camera.

9. A method according to claim 8 wherein said wafer alignment target is of the shape of a cross having an elongated arm generally oriented in a direction normal to said closest system axis, and having a relatively shorter laterial crossbar near the middle of said elongated arm.

10. A method for use in an apparatus requiring alignment of one article, said one article containing an alignment target that is viewed by a video camers, said method being used for verication that a feature in the image being viewed by said video camera is actually said alignment target, comprising:
utilizing for the shape of said target a cross having a relatively elongated arm and a relatively short crossbar near the middle of said elongated arm,
initially positioning said one article so that the image viewed by said video camera is near said middle and includes part of said elongated arm and part of said crossbar, and, at such position, verifying from the output of said video camera the presence in said image of both elongated arm part and said crossbar part, and
thereafter successively moving said one article to positions at which the image viewed by said video camera would be expected to include only part of one end of said elongated arm, only part of the other end of said elongated arm, only the region beyond one end of said elongated arm and only the region beyond the other end of said elongated arm, and at each such position, verifying from the output of said video camera the expected presence or absence of said arm parts.

11. A method according to claim 10 wherein said one article is to be aligned with a second article, and wherein
said second article includes an alignment window through which said video camera views said alignment target, the length of said elongated arm on each side of said crossbar being longer than the width of the area viewed through said window by said video camera.

* * * * *